United States Patent
Fernandez et al.

(10) Patent No.: US 10,050,407 B1
(45) Date of Patent: Aug. 14, 2018

(54) CAVITY STABILIZED LASER DRIFT COMPENSATION

(71) Applicant: Raytheon Company, Waltham, MA (US)

(72) Inventors: Javier H. Fernandez, El Segundo, CA (US); Todd O. Clatterbuck, Los Angeles, CA (US); Gabriel N. Price, Redondo Beach, CA (US); Andrew N. Daniele, Granada Hills, CA (US); Michael S. Lackey, Torrance, CA (US); Chon Thai, El Segundo, CA (US); Darcy Bibb, Torrance, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/647,772

(22) Filed: Jul. 12, 2017

(51) Int. Cl.
| | |
|---|---|
| *H01S 3/13* | (2006.01) |
| *H01S 3/137* | (2006.01) |
| *H01S 5/0687* | (2006.01) |
| *H01S 3/136* | (2006.01) |
| *H01S 5/0683* | (2006.01) |
| *H01S 5/068* | (2006.01) |

(52) U.S. Cl.
CPC ............ *H01S 3/137* (2013.01); *H01S 3/13* (2013.01); *H01S 3/1304* (2013.01); *H01S 3/1305* (2013.01); *H01S 3/136* (2013.01); *H01S 5/0683* (2013.01); *H01S 5/0687* (2013.01); *H01S 5/06817* (2013.01); *H01S 5/06825* (2013.01)

(58) Field of Classification Search
CPC .......... H01S 3/13; H01S 3/1305; H01S 3/137; H01S 3/136; H01S 3/1304; H01S 5/0687; H01S 5/0683; H01S 5/06817; H01S 5/06825
See application file for complete search history.

(56) References Cited

U.S. PATENT DOCUMENTS

| | | | | |
|---|---|---|---|---|
| 6,654,394 | B1 * | 11/2003 | Sellin | H01S 5/0687 372/26 |
| 8,780,948 | B2 | 7/2014 | Wilkinson et al. | |
| 2004/0017833 | A1 * | 1/2004 | Cundiff | H01S 3/1112 372/18 |
| 2010/0329287 | A1 * | 12/2010 | Lecomte | H01S 3/1305 372/3 |
| 2013/0215918 | A1 * | 8/2013 | Wilkinson | H01S 3/1303 372/29.022 |
| 2017/0187161 | A1 * | 6/2017 | Fermann | H01S 3/1112 |
| 2018/0048113 | A1 * | 2/2018 | Fermann | H01S 3/1304 |

OTHER PUBLICATIONS

"OEM 1PPS Timing Module", Quartzlock A6-1PPS, [Online]. Retrieved from the Internet: <URL: www.quartzlock.com, (2017), 6 pgs.

* cited by examiner

*Primary Examiner* — Kinam Park
(74) *Attorney, Agent, or Firm* — Schwegman Lundberg & Woessner, P.A.

(57) ABSTRACT

Generally discussed herein are systems, devices, and methods for providing a frequency stabilized optical frequency comb, including frequency stabilizing the optical frequency comb to a laser that is frequency stabilized to an optical reference cavity, generating a low frequency electrical signal from the optical frequency comb, comparing the generated low frequency electrical signal to a reference low frequency electrical signal, determining an optical reference cavity drift based on the comparison, and then adjusting a frequency of the laser in response to the determined optical reference cavity drift.

20 Claims, 7 Drawing Sheets

CAVITY STABILIZED LASER DRIFT COMPENSATION

TECHNICAL FIELD

Embodiments discussed herein relate to devices, systems, and methods for providing cavity stabilized laser drift compensation in an optical frequency comb system.

BACKGROUND

In certain systems, an optical frequency comb can have a very low phase noise over short time scales (e.g., time scales less than one second). The optical frequency comb can have a slow drift, such as can be due to drift of a cavity stabilized laser that can be used to stabilize the optical frequency comb. The slow drift can impact performance.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments or examples discussed in the present document.

SUMMARY

According to an embodiment, a method for providing a frequency stabilized optical frequency comb can include frequency stabilizing the optical frequency comb to a laser that is frequency stabilized to an optical reference cavity. The method can also include generating a low frequency electrical signal from the optical frequency comb. The method can also include comparing the generated low frequency electrical signal to a reference low frequency electrical signal. The method can also include determining an optical reference cavity drift based on the comparison. The method can also include then adjusting a frequency of the laser in response to the determined optical reference cavity drift. The method can also include using a Kalman filter to determine the optical reference cavity drift. The method can also include using the Kalman filter to estimate a clock time error and a clock oscillation period error. The method can also include using the Kalman filter to estimate all states associated with a second order drift model. The method can also include measuring a variance of at least one electrical component and providing the measured variance as a parameter to the Kalman filter. The method can also include adjusting a frequency of the laser at a first rate greater than the frequency of the low frequency electrical signal. Generating the low frequency electrical signal can include generating a radio-frequency signal by optical division, and then generating the low frequency electrical signal based on the generated radio-frequency signal. The low frequency electrical signal and the reference electrical signal can include a one pulse per second signal. The method can also include using an inner control loop to adjust a clock oscillation period error to zero. The method can also include using an outer control loop to adjust a clock time error to zero.

According to another embodiment, a system for providing a frequency stabilized optical frequency comb can include an optical frequency comb. The system can also include an optical reference cavity configured to receive a laser beam and provide a portion of the received laser beam to the optical frequency comb. The system can also include a frequency generation unit configured to generate a low frequency electrical signal from the optical frequency comb. The system can also include a controller configured to compare the generated low frequency electrical signal to a reference electrical signal, determine an optical reference cavity drift based on the comparison, and then adjust a frequency of the laser in response to the determined optical reference cavity drift. The controller can be configured to implement a Kalman filter to estimate the optical reference cavity drift. The controller can be configured to implement the Kalman filter to estimate a clock time error and a clock oscillation period error. The controller can be configured to implement the Kalman filter to estimate all states associated with a second order drift model. The controller can be configured to receive a measurement of a variance of at least one electrical component and provide the measurement of the variance as a parameter to the Kalman filter. The controller can be configured to adjust a frequency of the laser at a first rate greater than the frequency of the low frequency electrical signal. The controller can be configured to generate a radio-frequency signal, and then generate the low frequency electrical signal based on the generated radio-frequency signal. The low frequency electrical signal and the reference electrical signal can include a one pulse per second signal. The system can also include an inner control loop to adjust a clock oscillation period error to zero. The system can also include an outer control loop to adjust a clock time error to zero.

DETAILED DESCRIPTION

Embodiments in this disclosure generally relate to cavity stabilized laser drift compensation.

In certain systems where an optical frequency comb can be stabilized to an optical reference cavity, drifts in the optical reference cavity, such as mechanical drifts or thermal drifts, can lead to decreased performance of the optical frequency comb. The inventors have recognized, among other things, that it is possible to estimate the drift in the optical reference cavity, such as by stabilizing the optical frequency comb to a reference 1PPS signal. Feedback circuitry can adjust system parameters to compensate for the estimated drift in the optical reference cavity.

Figure 1:
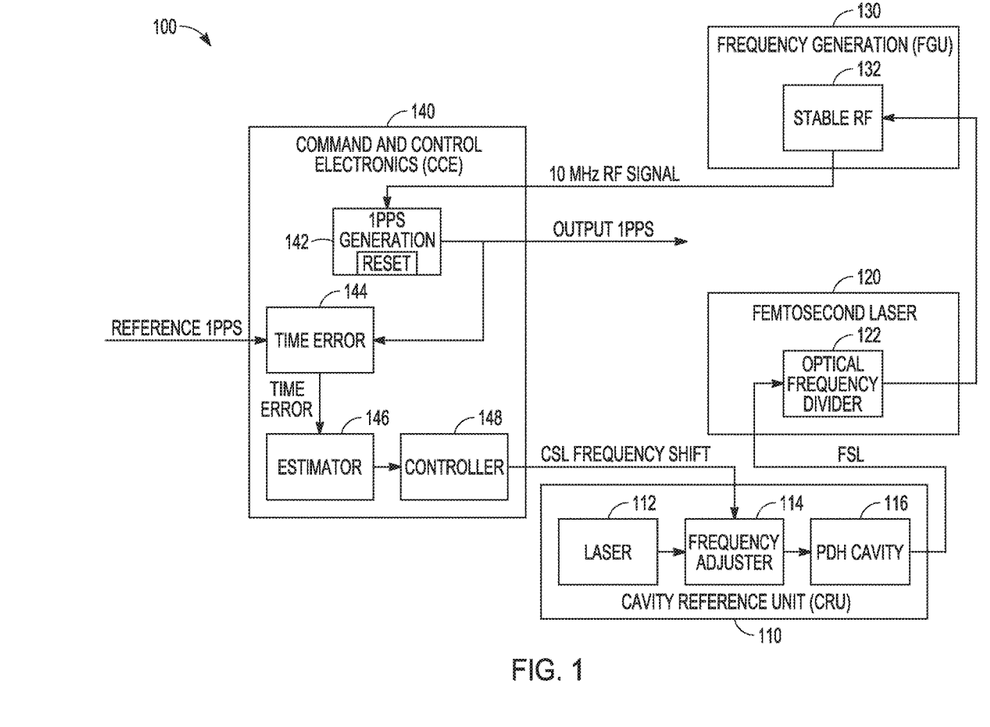
FIG. 1 illustrates, by way of example, a precision photonic oscillator for providing a stabilized optical frequency comb

FIG. 1 illustrates an example of a precision photonic oscillator 100 for providing a stabilized optical frequency comb. The system can include a cavity reference unit 110, a femtosecond laser 120, a frequency generation unit 130, and command and control electronics 140. The cavity reference unit 110 can include a laser 112, a frequency adjuster 114, and an optical reference cavity 116. The laser 112 can be a continuous wave laser, including, but not limited to fiber lasers, diode lasers, gas lasers, and solid state lasers. The optical reference cavity 116 can be an ultra-low expansion cavity, and can be of any suitable construction or configuration, including, for example, a block of ultra-low expansion glass. The frequency adjuster 114 can include an electro-optic modulator. The femtosecond laser 120 can include an optical frequency divider 122. The command and control electronics 140 can include a 1PPS generation circuit 142, a clock time error circuit 144, an estimator 146, and a controller 148.

During operation, a frequency of the laser 112 can be adjusted, such as to tune the frequency of the laser 112 to a resonance of the optical reference cavity 116. The frequency of a laser beam emitted by the laser 112 can be adjusted by the frequency adjuster 114. The optical reference cavity 116 can receive the laser beam emitted by the laser 112 and can provide a transmitted portion of the received laser beam to the femtosecond laser 120. A portion of the laser beam emitted by the laser 112 can be reflected by the optical reference cavity 116 and the reflected portion of the laser beam can be used to stabilize the frequency of the emitted laser beam by using, for example, the Pound-Drever-Hall method. The optical frequency divider 122 can receive a portion of a laser beam provided by the optical reference cavity and can stabilize an optical frequency comb generated by the femtosecond laser 120 to the received laser beam, for example, by stabilizing one comb line of the optical frequency comb to the received laser beam. The frequency generation unit 130 can receive a portion of the optical frequency comb generated by the femtosecond laser 120. The frequency generation unit can generate a radio-frequency signal based on the received portion of the optical frequency comb. In an example, the frequency generation unit can generate a 10 MHz radio-frequency signal based on the received portion of the optical frequency comb. The radio-frequency signal can be provided to a 1PPS generation circuit and the 1PPS generation circuit can generate a 1PPS signal based thereon. The 1PPS signal can be compared to a reference 1PPS signal by the clock time error circuit 144. In an example, the 1PPS reference signal can be provided by a local Rubidium oscillator. The clock time error circuit 144 can generate a time difference measurement between the 1PPS signal provided by the 1PPS generation circuit and the reference 1PPS signal and can provide the time difference measurement to the estimator circuit 146. The estimator circuit 146 can estimate a drift in the optical reference cavity 116 based on the received time difference measurement. The estimator circuit 146 can provide the estimated drift in the optical reference cavity to the controller 148. The controller can instruct the frequency adjuster 114 to adjust a frequency of the laser beam emitted by the laser 112 to compensate for the estimated drift in the optical reference cavity. A Kalman filter can be implemented by the estimator circuit 146 and can be used to simulate error dynamics. Because the dynamics can be linear and time-invariant, unlike traditional navigation problems, the Kalman filter can be a steady-state Kalman filter.

Figure 2A:
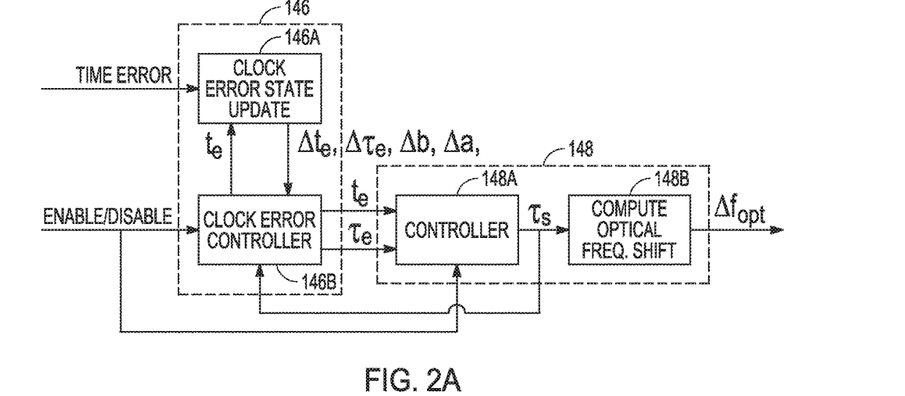
FIG. 2A illustrates, by way of example, an estimator and a controller, in an optical frequency comb system.

FIG. 2A illustrates an example of an estimator 146 and a controller 148, as illustrated in FIG. 1. The estimator 146 can include a clock error state updater 146a and a clock error estimator 146b. The controller 148 can include a controller 148a and an optical frequency shift computer 148b. During operation, the clock error state updater 146a can receive a clock time error, such as from the clock time error circuitry 144. The clock time error can represent a difference between the reference 1PPS signal and the 1PPS signal provided by the 1PPS generation circuit 142. The clock error state updater 146a can also receive an estimation of the clock time error $t_e$ from the clock error estimator 146b. The clock error state updater 146a can update the clock error states based on the received inputs and can provide updated clock error states to the clock error estimator 146b. The clock error estimator 146b can receive the updated clock error states, $\Delta t_e$, $\Delta \tau_e$, $\Delta a$, $\Delta b$, and can provide an updated clock time error $t_e$, and a clock oscillation period error $\tau_e$ based thereon. The controller 148a can determine a value of the control input $\tau_s$ that can provide an adjustment of the clock oscillation period, such as to counteract a drift of the optical reference cavity as determined by the controller 148a. The value of the control input $\tau_s$ can then be converted to a value of an optical frequency shift.

Figure 2B:
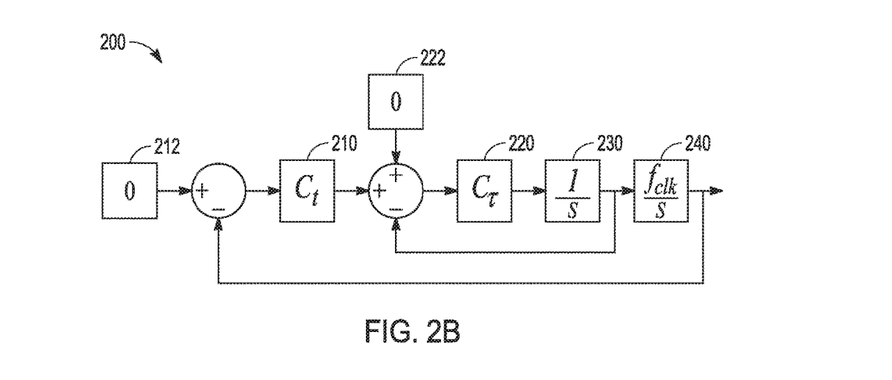
FIG. 2B illustrates, by way of example, control architecture of a controller.

FIG. 2B illustrates an example of control architecture of a controller, such as the controller 148, for regulating the clock time and clock oscillation period as determined by a Kalman filter described above. The control architecture 200 can include an outer loop controller 210, an inner loop controller 220, an integrator 230, and an integrator 240. During operation, an input to the outer loop controller 210 can include an estimate of the clock time error $t_e$. A command signal 212 can be used to drive the clock time error $t_e$ to zero. The outer loop controller 210 can receive an estimate of the clock time error $t_e$. An output of the outer loop controller 210 can be provided to the input of the inner loop controller 220. The inner loop controller 220 can receive an estimate of the clock oscillation period error $\tau_e$. The output of the inner loop controller 220 can include a change in the clock oscillator period $\tau_c$. The integrators 230 and 240 can convert the change in clock oscillator period to a change in an optical frequency. The determined change in the optical frequency can be used to adjust the frequency of the light beam emitted by the laser 112 to compensate for example, a drift in the optical reference cavity 116.

Figure 3:
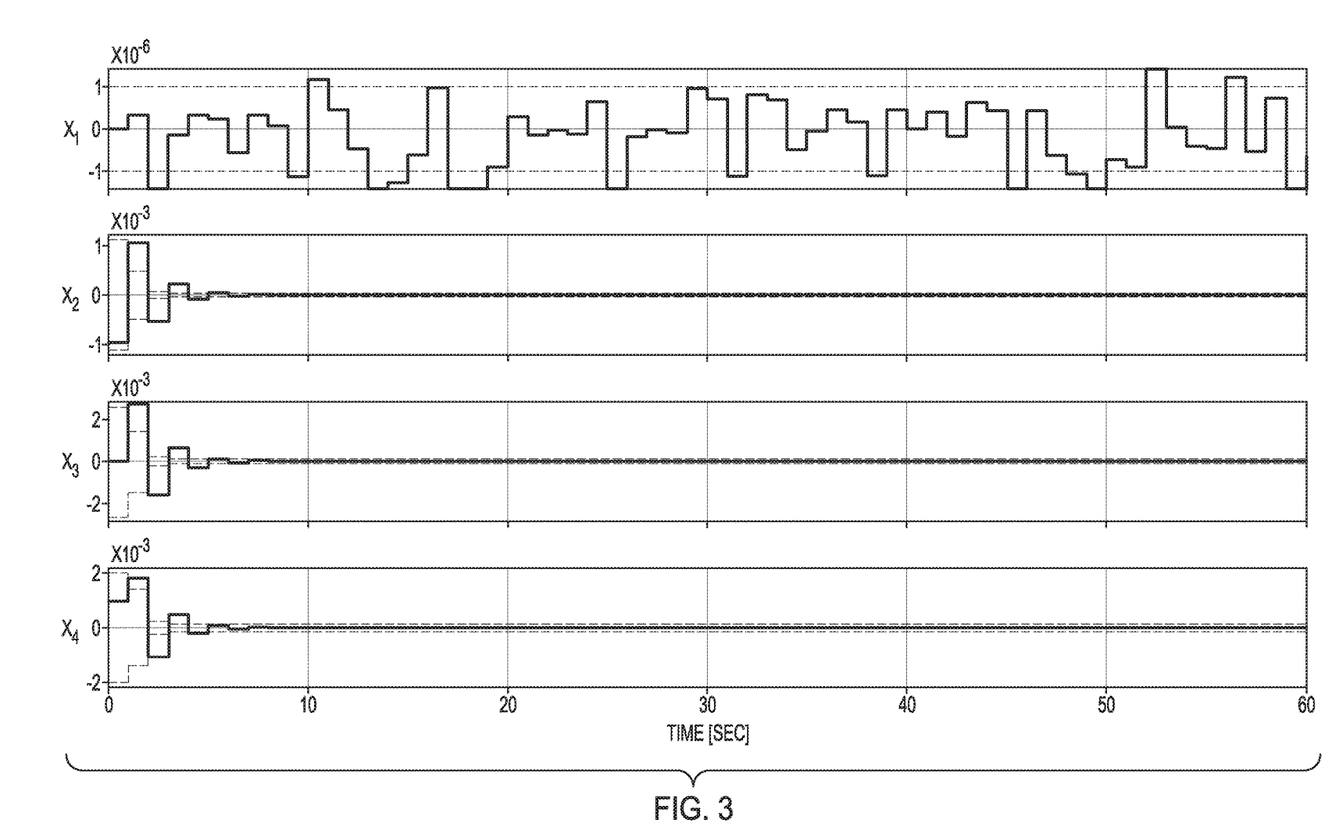
FIG. 3 illustrates, by way of example, simulated results for the error states of a Kalman filter.

FIG. 3 illustrates simulated results for the error states of a Kalman filter, such as those updated by the clock error state updater 146a. The first error state $x_1$ can correspond to a clock time error $t_e$, the second error state $x_2$ can correspond to a clock oscillation period error $\tau_e$, the third error state $x_3$ can correspond to a second order drift term a, and the fourth error state $x_4$ can also correspond to a second order drift term b. During operation of the clock error state updater 146a, an error in the clock time error $t_e$ can be determined based on a time difference measurement between the 1PPS signal provided by the 1PPS generation circuit and the reference 1PPS signal. An error in the clock oscillation period error $\tau_e$, the second order drift term a, and the second order drift term b can also be determined based on the time difference measurement between the 1PPS signal provided by the 1PPS generation circuit and the reference 1PPS signal. The errors in the estimates of the clock oscillation period error $\tau_e$, the second order drift term a, and the second order drift term b can converge to zero after several updates of the time difference measurement between the 1PPS signal provided by the 1PPS generation circuit and the reference 1PPS signal. The clock time error to can continue to fluctuate, even after several updates of the time difference measurement between the 1PPS signal provided by the 1PPS generation circuit and the reference 1PPS signal. In an example, the clock error state updater 146a can be updated at a first rate and the clock error estimator 146b can be updated at a second rate, where the second rate can be faster than the first rate. In an example the clock error state updater 146a can be updated at a rate of approximately 1 Hz and the clock error state estimator 146b can be updated at a rate of approximately 10 Hz. Electrical noise associated with the 1PPS generation circuit 142 can be input as a parameter into the Kalman filter. For example, a measurement error variance of an atomic oscillator, a measurement error variance of an electronic buffer, a measurement error variance of a phase detector, and/or a measurement error of an analog-to-digital converter can be provided as parameters to the Kalman filter. Process noise associated with each of the four states in the clock dynamics can be input as a parameter into the Kalman filter. For example, a process noise variance of a first clock buffer, a process noise variance of a flip flop, and/or a process noise variance of a second clock buffer can be provided as parameters to the Kalman filter to describe process noise associated with the clock time. In another example, a process noise variance associated with jitter in a 10 MHz output can be provided as a parameter to the Kalman filter to describe process noise associated with the clock oscillation period.

Figure 4A:
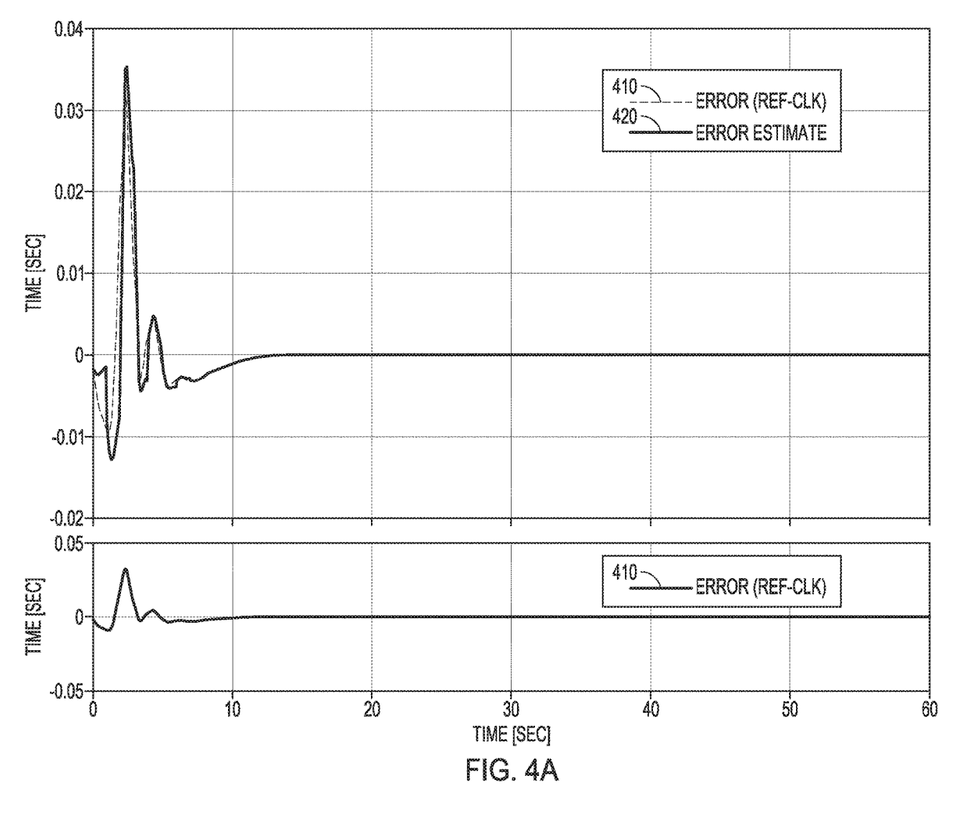
FIGS. 4A and 4B illustrate, by way of example, clock time errors and estimates of clock time errors as a function of time.
Figure 4B:
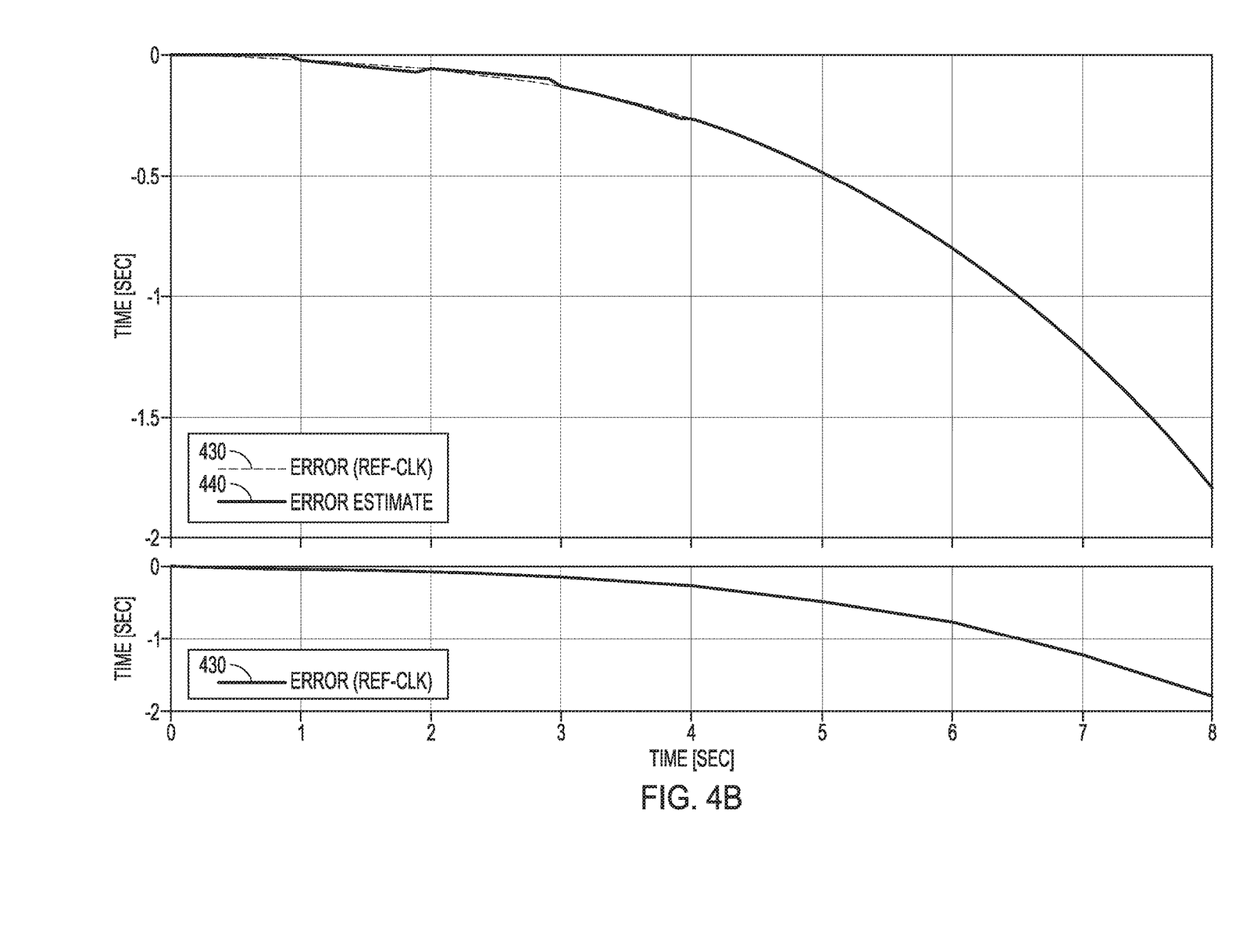

FIGS. 4A and 4B illustrate examples of clock time errors and estimates of clock time errors as a function of time. In the example shown in FIG. 4A, feedback can be enabled and the frequency adjuster 114 can adjust a frequency of the laser beam emitted by the laser 112 to compensate for estimated drifts in the optical reference cavity. In the example shown in FIG. 4B feedback can be disabled and the estimated drifts in the optical reference cavity can remain uncompensated. FIG. 4A illustrates an example of a clock time error as a function of time. In a first trace 410, a clock time error can be determined based on a time difference measurement between the 1PPS signal provided by the 1PPS generation circuit and the reference 1PPS signal. In a second trace 420, the clock time error can be estimated by a Kalman filter, such as that implemented by the estimator circuit 146. The second trace 420 can closely match the first trace 410. Based on the estimated clock time error, the controller 148 can instruct the frequency adjuster 114 to adjust a frequency of the laser beam emitted by the laser 112 to compensate for the estimated drift in the optical reference cavity. After several updates of the clock error state updater 146a, both the time clock error shown in the first trace 410 and the clock time error estimated by the Kalman filter can approach to zero. FIG. 4B illustrates an example of a clock time error as a function of time. In a first trace 430, a clock time error can be determined based on a time difference measurement between the 1PPS signal provided by the 1PPS generation circuit and the reference 1PPS signal. In a second trace 440, the clock time error can be estimated by a Kalman filter, such as that implemented by the estimator circuit 146. The second trace 440 can closely match the first trace 430. In the example shown in FIG. 4B, the frequency adjuster can be inactive, and estimated drifts in the optical reference cavity can remain uncompensated.

Figure 5:
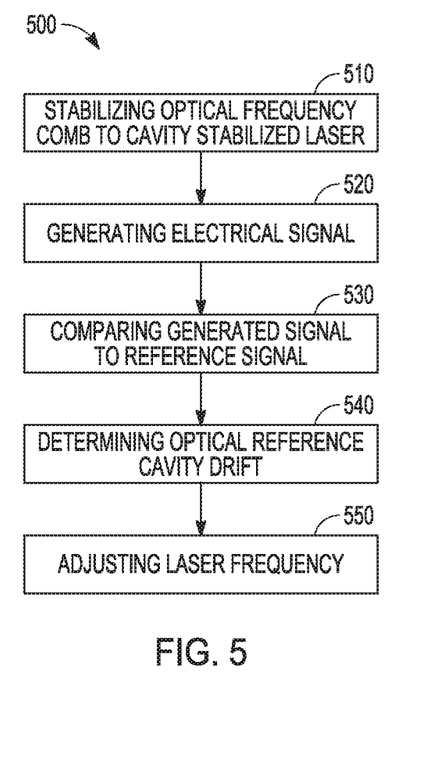
FIG. 5 illustrates, by way of example, a method of operation of a precision photonic oscillator.

FIG. 5 illustrates, by way of example, a method for operating a system for stabilizing an optical frequency comb, such as the precision photonic oscillator 100. An optical frequency comb generated by the femtosecond laser 120 can be stabilized to the laser 112 that is frequency stabilized to the optical reference cavity 116 (step 510). The frequency generation unit 130 can receive at least a portion of the optical frequency comb and can generate a low frequency signal therefrom (step 520). The clock time error circuit 144 can compare the generated low frequency electrical signal to a reference low frequency electrical signal (step 530). The estimator 146 can determine an optical reference cavity drift based on the comparison (step 540).

The frequency adjuster 114 can then adjust a frequency of the laser in response to the determined optical reference cavity drift (step 550).

Figure 6:
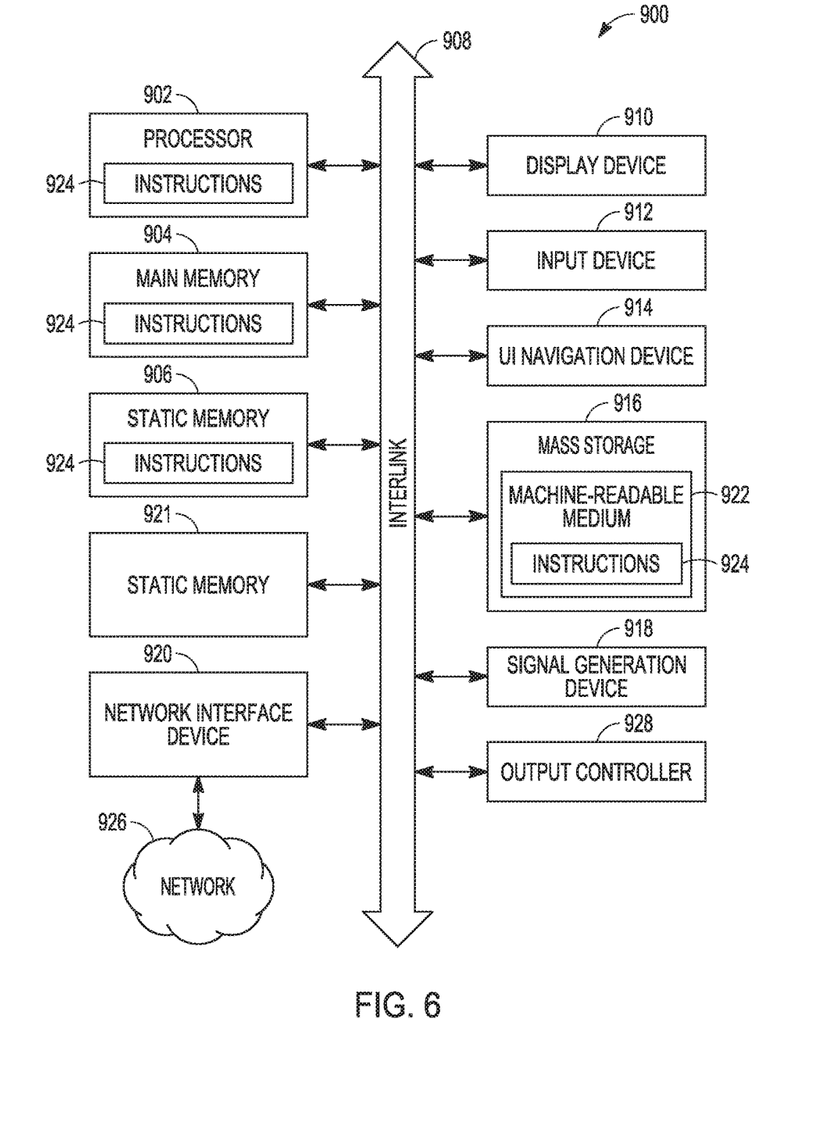
FIG. 6 illustrates, by way of example, a block diagram of an embodiment of a machine on which one or more of the methods as discussed herein can be implemented.

FIG. 6 illustrates, by way of example, a block diagram of an embodiment of a machine 800 on which one or more of the methods as discussed herein can be implemented. In one or more embodiments, one or more items of the command and control electronics 140 can be implemented by the machine 800. In alternative embodiments, the machine 800 operates as a standalone device or may be connected (e.g., networked) to other machines. In one or more embodiments, the command and control electronics 140 can include one or more of the items of the machine 800. In a networked deployment, the machine 800 may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 800 includes processing circuitry 902 (e.g., a central processing unit (CPU), a graphics processing unit (GPU), an application specific integrated circuit, circuitry, such as one or more transistors, resistors, capacitors, inductors, diodes, logic gates, multiplexers, buffers, modulators, demodulators, radios (e.g., transmit or receive radios or transceivers), sensors 921 (e.g., a transducer that converts one form of energy (e.g., light, heat, electrical, mechanical, or other energy) to another form of energy), or the like, or a combination thereof), a main memory 904 and a static memory 906, which communicate with each other via a bus 908. The machine 800 (e.g., computer system) may further include a video display unit 910 (e.g., a liquid crystal display (LCD) or a cathode ray tube (CRT)). The machine 800 also includes an alphanumeric input device 912 (e.g., a keyboard), a user interface (UI) navigation device 914 (e.g., a mouse), a disk drive or mass storage unit 916, a signal generation device 918 (e.g., a speaker) and a network interface device 920.

The disk drive unit 916 includes a machine-readable medium 922 on which is stored one or more sets of instructions and data structures (e.g., software) 924 embodying or utilized by any one or more of the methodologies or functions described herein. The instructions 924 may also reside, completely or at least partially, within the main memory 904 and/or within the processor 902 during execution thereof by the machine 800, the main memory 904 and the processor 902 also constituting machine-readable media.

The machine 800 as illustrated includes an output controller 928. The output controller 928 manages data flow to/from the machine 800. The output controller 928 is sometimes called a device controller, with software that directly interacts with the output controller 928 being called a device driver.

While the machine-readable medium 922 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 924 may further be transmitted or received over a communications network 926 using a transmission medium. The instructions 924 may be transmitted using the network interface device 920 and any one of a number of well-known transfer protocols (e.g., HTTP). Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

As used herein, "communicatively coupled between" means that the entities on either of the coupling must communicate through an item therebetween and that those entities cannot communicate with each other without communicating through the item.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A method for providing a frequency stabilized optical frequency comb, the method comprising:
    frequency stabilizing the optical frequency comb to a laser that is frequency stabilized to an optical reference cavity;
    generating a low frequency electrical signal from the optical frequency comb;
    comparing the generated low frequency electrical signal to a reference low frequency electrical signal;
    determining an optical reference cavity drift based on the comparison; and
    then adjusting a frequency of the laser in response to the determined optical reference cavity drift.

2. The method of claim 1 further comprising using a Kalman filter to determine the optical reference cavity drift.

3. The method of claim 2 further comprising using the Kalman filter to estimate a clock time error and a clock oscillation period error.

4. The method of claim 3 further comprising using the Kalman filter to estimate all states associated with a second order drift model.

5. The method of claim 2 further comprising measuring a variance of at least one electrical component and providing the measured variance as a parameter to the Kalman filter.

6. The method of claim 2 further comprising adjusting a frequency of the laser at a first rate greater than the frequency of the low frequency electrical signal.

7. The method of claim 1 wherein generating the low frequency electrical signal includes generating a radio-frequency signal by optical division, and then generating the low frequency electrical signal based on the generated radio-frequency signal.

8. The method of claim 1 wherein the low frequency electrical signal and the reference electrical signal include a one pulse per second signal.

9. The method of claim 3 further comprising using an inner control loop to adjust a clock oscillation period error to zero.

10. The method of claim 9 further comprising using an outer control loop to adjust a clock time error to zero.

11. A system for providing a frequency stabilized optical frequency comb, the system comprising:
    an optical frequency comb;
    an optical reference cavity configured to receive a laser beam and provide a portion of the received laser beam to the optical frequency comb;
    a frequency generation unit configured to generate a low frequency electrical signal from the optical frequency comb;
    a controller configured to:
        compare the generated low frequency electrical signal to a reference electrical signal;
        determine an optical reference cavity drift based on the comparison; and
        then adjust a frequency of the laser in response to the determined optical reference cavity drift.

12. The system of claim 11 wherein the controller is configured to implement a Kalman filter to estimate the optical reference cavity drift.

13. The system of claim 12 wherein the controller is configured to implement the Kalman filter to estimate a clock time error and a clock oscillation period error.

14. The system of claim 13 wherein the controller is configured to implement the Kalman filter to estimate all states associated with a second order drift model.

15. The system of claim 12 wherein the controller is configured to receive a measurement of a variance of at least one electrical component and provide the measurement of the variance as a parameter to the Kalman filter.

16. The system of claim 12 wherein the controller is configured to adjust a frequency of the laser at a first rate greater than the frequency of the low frequency electrical signal.

17. The system of claim 11 wherein the controller is configured to generate a radio-frequency signal, and then generate the low frequency electrical signal based on the generated radio-frequency signal.

18. The system of claim 11 wherein the low frequency electrical signal and the reference electrical signal include a one pulse per second signal.

19. The system of claim 13 further comprising an inner control loop to adjust a clock oscillation period error to zero.

20. The system of claim 19 further comprising an outer control loop to adjust a clock time error to zero.

* * * * *

UNITED STATES PATENT AND TRADEMARK OFFICE
CERTIFICATE OF CORRECTION

PATENT NO. : 10,050,407 B1
APPLICATION NO. : 15/647772
DATED : August 14, 2018
INVENTOR(S) : Fernandez et al.

It is certified that error appears in the above-identified patent and that said Letters Patent is hereby corrected as shown below:

In the Specification

In Column 1, Line 30, after "comb", insert --.--

In Column 4, Line 60, delete "to" and insert --$t_e$-- therefor

Signed and Sealed this
Eighteenth Day of June, 2019

Andrei Iancu
*Director of the United States Patent and Trademark Office*